US012207391B2

United States Patent
Liu et al.

(10) Patent No.: US 12,207,391 B2
(45) Date of Patent: Jan. 21, 2025

(54) HATCHING GROUND UNDER A PAD IN A PRINTED CIRCUIT BOARD

(71) Applicant: Dell Products L.P., Round Rock, TX (US)

(72) Inventors: Zhenli Liu, Shanghai (CN); Lingyu Kong, Shanghai (CN); Bhyrav Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 263 days.

(21) Appl. No.: 17/728,131

(22) Filed: Apr. 25, 2022

(65) Prior Publication Data

US 2023/0345620 A1    Oct. 26, 2023

(51) Int. Cl.
H05K 1/02    (2006.01)
H05K 1/11    (2006.01)

(52) U.S. Cl.
CPC ........... *H05K 1/0228* (2013.01); *H05K 1/111* (2013.01); *H05K 2201/09236* (2013.01)

(58) Field of Classification Search
CPC .... H05K 1/025; H05K 1/0251; H05K 1/0253; H05K 1/111; H05K 1/0228
See application file for complete search history.

(56) References Cited

U.S. PATENT DOCUMENTS

| | | | |
|---|---|---|---|
| 2008/0227311 A1* | 9/2008 | Chan | H01R 13/6461 439/74 |
| 2009/0294152 A1* | 12/2009 | Lin | H05K 1/0253 174/250 |
| 2019/0289714 A1 | 9/2019 | Kumar et al. | |
| 2020/0068703 A1* | 2/2020 | Kagaya | H04B 10/50 |
| 2021/0378094 A1 | 12/2021 | Chandra et al. | |

* cited by examiner

*Primary Examiner* — Jeremy C Norris
(74) *Attorney, Agent, or Firm* — Larson Newman, LLP

(57) ABSTRACT

An information handling system includes a printed circuit board. The printed circuit board includes first and second pads of a first differential pair, a hatched ground, and first and second traces of a second differential pair. The first and second pads of the first differential pair are routed a surface of the printed circuit board. The hatched ground routed within a first layer of the printed circuit board. The first and second traces of the second differential pair are routed below the first and second pads and the hatched ground within a second layer of the printed circuit board. The hatched ground dampens crosstalk between signals on the traces and signals on the differential pair pads.

17 Claims, 7 Drawing Sheets

HATCHING GROUND UNDER A PAD IN A PRINTED CIRCUIT BOARD

FIELD OF THE DISCLOSURE

The present disclosure generally relates to information handling systems, and more particularly relates to hatching ground under a pad in a printed circuit board.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes a printed circuit board. The printed circuit board includes first and second pads of a first differential pair, a hatched ground, and first and second traces of a second differential pair. The first and second pads of the first differential pair are routed a surface of the printed circuit board. The hatched ground routed within a first layer of the printed circuit board. The first and second traces of the second differential pair are routed below the first and second pads and the hatched ground within a second layer of the printed circuit board. The hatched ground may provide crosstalk dampening between signals on the traces and signals on the differential pair pads.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
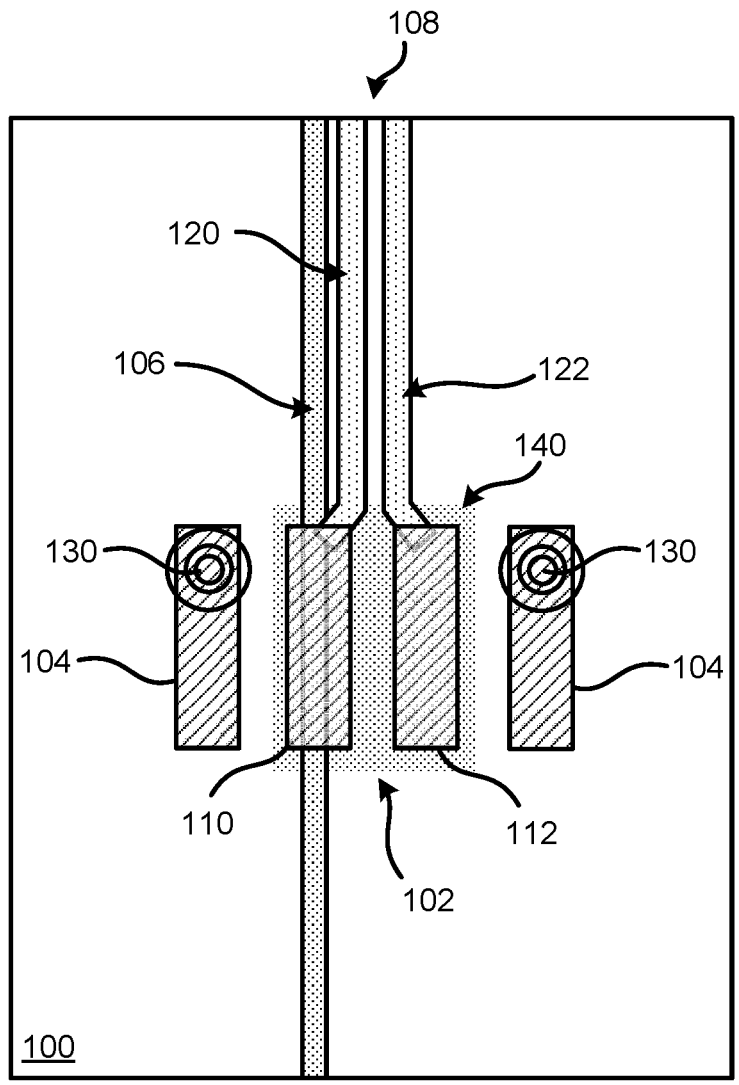
FIG. 1 is a diagram of a printed circuit board with a hatched ground below different signal pads according to at least one embodiment of the present disclosure.
Figure 7:
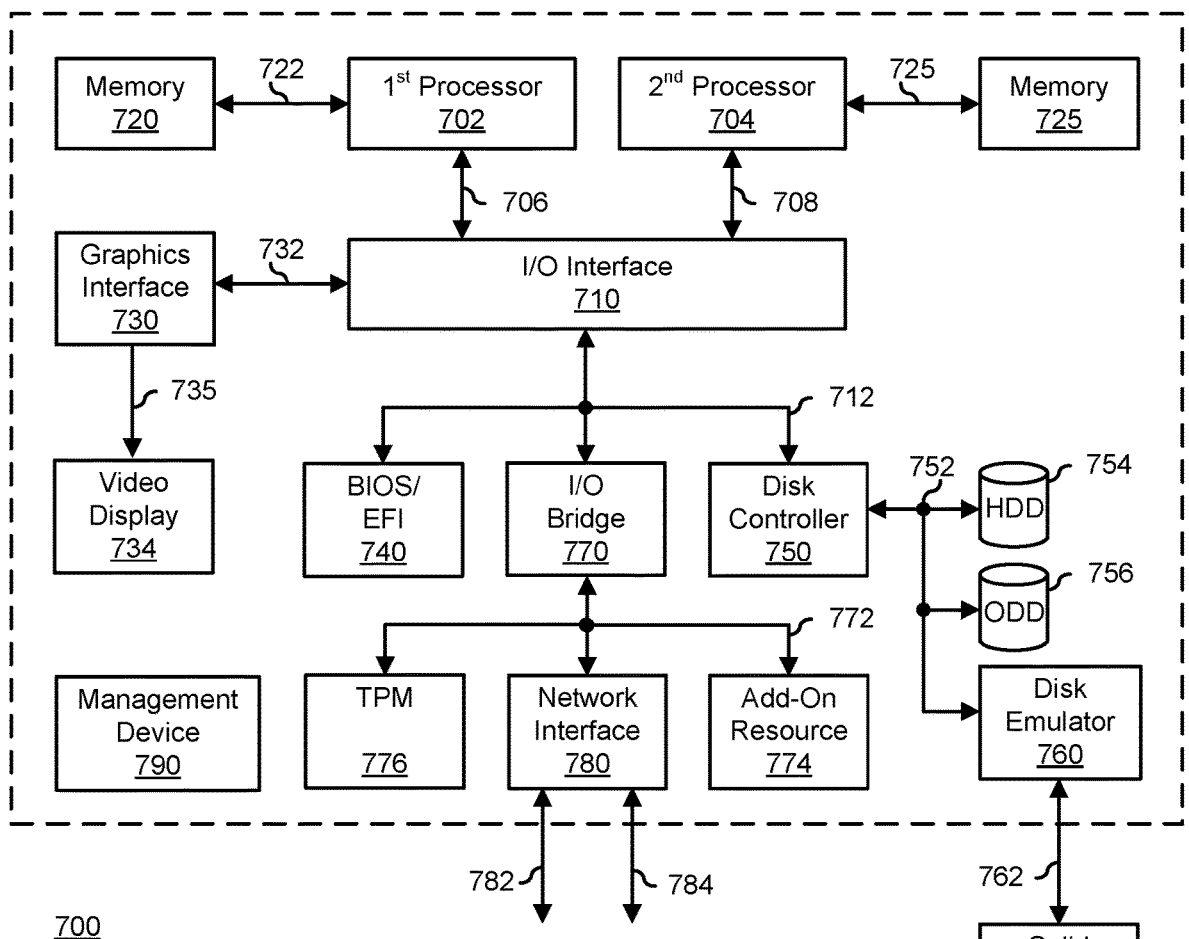
FIG. 7 is a block diagram of a general information handling system according to an embodiment of the present disclosure.

FIG. 1 illustrates a printed circuit board (PCB) 100 of an information handling system, such as information handling system 700 of FIG. 7, according to at least one embodiment of the present disclosure. For purpose of this disclosure information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch, a router, or another network communication device, or any other suitable device and may vary in size, shape, performance, functionality, and price.

PCB 100 includes a differential pair 102, ground pads 104, and a strip line 106. Differential pair 102 includes pads 110 and 112. Each ground pad 104 may be physically and electrically coupled to a ground layer of PCB 100 by a respective ground via 130 and ground trace. PCB 100 also includes signal traces 120 and 122. Signal trace 120 may be electrically and physically connected to pad 110 of differential pair 102. Similarly, signal trace 122 may be electrically and physically connected to pad 112 of differential pair 102. PCB 100 may include additional components without varying from the scope of this disclosure. The details of PCB manufacture, and particularly the forming of vias and traces on a PCB are known in the art and will not be further described herein, except as needed to illustrate the current embodiments.

In certain examples, strip line 106 may be located on any suitable layer of PCB 100. For example, strip line 106 may be within layer 3 of PCB, and may be utilized for signal transmission. Strip line 106 may have any suitable impedance value, such as 85 ohms. In an example, pads 110 and 112 may be surface mount connectors (SMTs) for differential pair 102. Signal traces 120 and 122 may be any suitable type of metal layer within a particular layer of PCB 100. For example, signal traces 120 and 122 may be differential microstrip lines on layer 1 of PCB 100, and may be connected to respective pads 110 and 112 by vias. Signal traces 120 and 122 may have any suitable impedance value, such as 45 ohms. In an example, hatched ground 140 may be located between strip line 106 and signal traces 120 and 122, such as in layer 2 of PCB 100.

In an example, impedances of high-speed signals may dramatically decrease as a pad area of SMT connectors increases, such as pads 110 and 112. In previous PCBs, a void under pad was utilized to control or set the impedance of the high-speed signals. However, no trace routing may be located under the void, because the void would not prevent crosstalk between the high-speed signals on the differential pads and the signals on the trace routing within the PCB. PCB 100 may be improved by utilizing hatched ground 140 under pads 110 and 112 to enable routing under the hatched ground while reducing or dampening crosstalk and providing impedance control for the high-speed signals on the pads. In this example, trace routing under hatched ground 140 may enable the board density of PCB 100 to be increased as compared to previous PCBs based on traces being routed below pads 110 and 112.

In certain examples, PCB 100 may include any suitable number of hatched grounds 140. For example, PCB 100 may include a hatched ground 140 between each downwardly adjacent signal layer. In an exemplary non-limiting embodiment, PCB 100 may include pads 110 and 112 on a surface of the PCB, signal traces 120 and 122 within layer 1 of the PCB, hatched ground 140 within layer 2 of the PCB, strip line 106 within layer 3 of the PCB, another hatched ground within layer 4 of the PCB, another strip line within layer 5 of the PCB, etc. In an example, hatched grounds 140 may be utilized as ground references for the signals transmitted on the signal layers of PCB 100. In certain examples, hatched ground 140 may include any suitable hatch size, such as 1 mil×1 mil, 3 mil×3 mil, 5 mil×5 mil, 7 mil×7 mil, 9 mil×9 mil, or the like. While hatched ground 140 is described as having square shaped hatching, the hatched ground may include rectangular shaped hatching without varying from the scope of this disclosure. One of ordinary skill in the art would recognize that mil is a unit of measurement utilized in routing on PCBs, and one mil equals one-thousandth of an inch or two hundred fifty four ten-thousandths of a millimeter.

Figure 2:
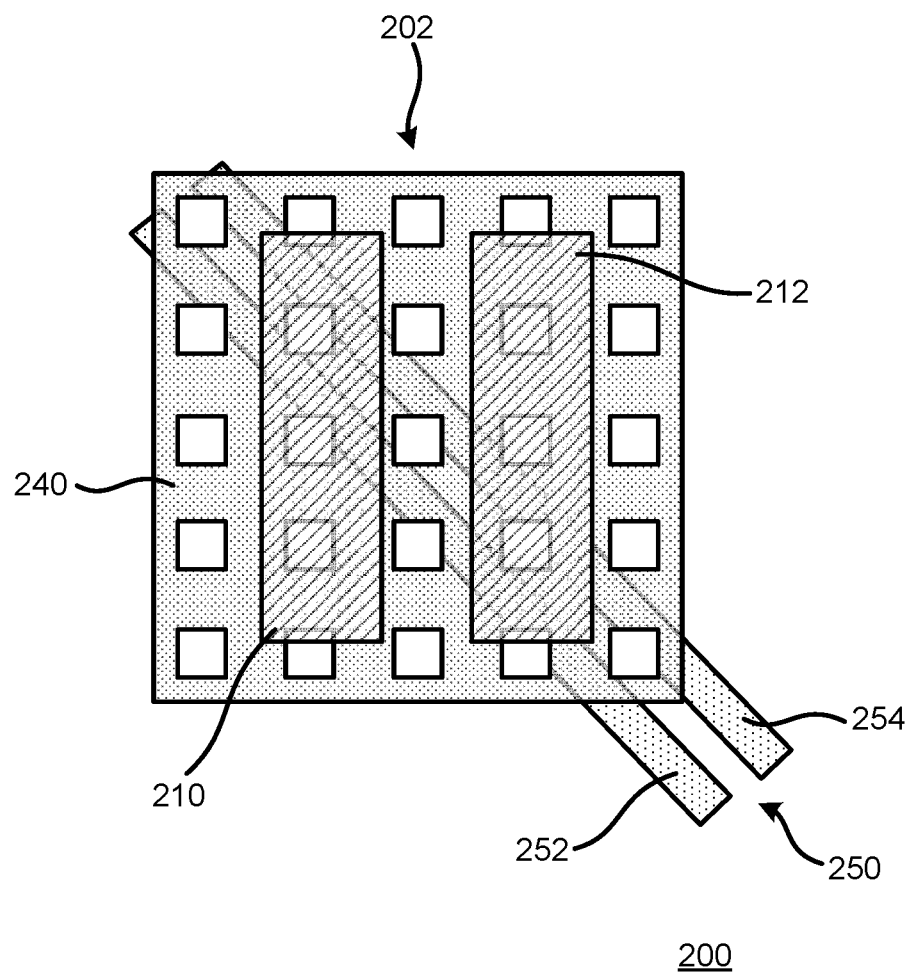
FIG. 2 is a diagram of a portion of a printed circuit board having an embodiment of a hatched ground below different signal pads according to at least one embodiment of the present disclosure.
Figure 3:
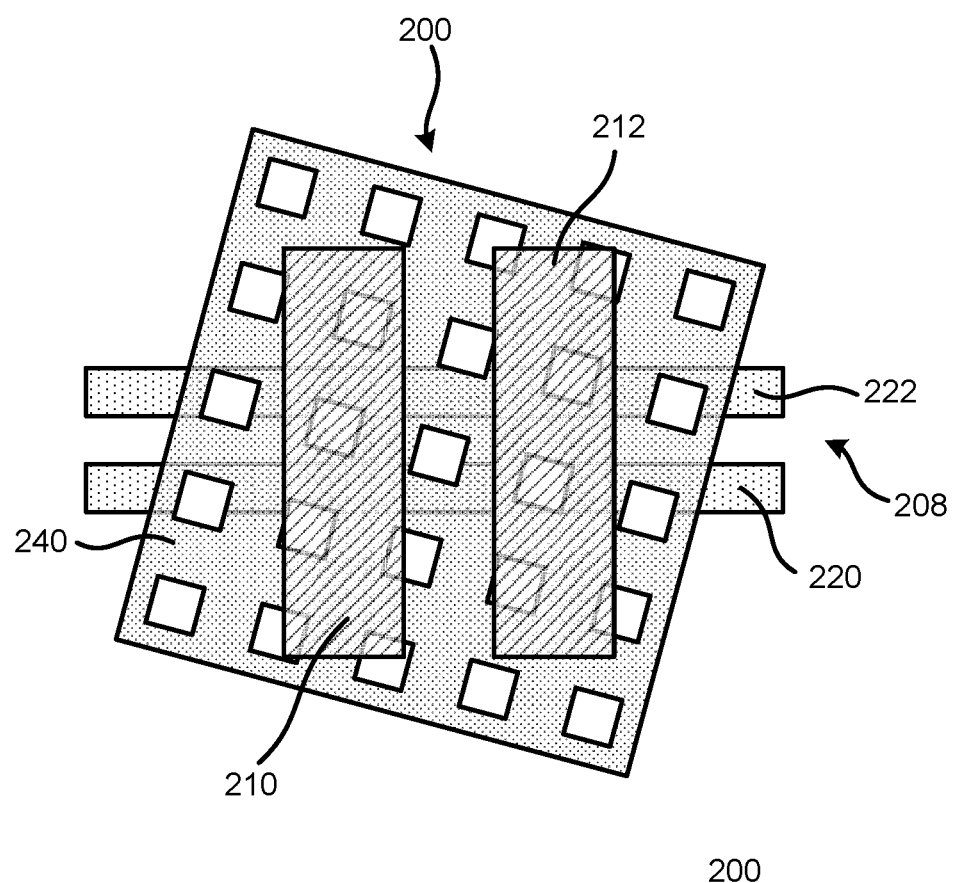
FIG. 3 is a diagram of a portion of a printed circuit board having another embodiment of a hatched ground below different signal pads according to at least one embodiment of the present disclosure.

FIGS. 2 and 3 illustrate a portion 200 of a PCB, such as PCB 100, according to at least one embodiment of the present disclosure. PCB portion 200 includes a differential pair 202, which in turn includes pads 210 and 212. PCB portion 200 also includes a hatched ground 240 and a differential pair 250. In certain examples, pads 210 and 212 of differential pair 202 may be substantially similar to pads 110 and 112 of differential pair 102 on PCB 100 in FIG. 1. Similarly, hatched ground 240 may be substantially similar to hatched ground 140 of PCB 100 in FIG. 1. Differential pair 250 includes traces 252 and 254. Pads 210 and 212 of differential pair 202 may be SMT connectors to enable signals to be transmitted from the PCB to other PCBs within a particular information handling system, such as information handling system 700 of FIG. 7.

In an example, hatched ground 240 may improve the signal integrity (SI) performance for high-speed signals transmitted on differential pairs 202 and 250. For example, hatched ground 240 may provide a ground plane between differential pairs 202 and 250, which in turn may reduce the crosstalk between signals on the differential pairs. For example, PCB portion 200 may include pads 210 and 212 on a surface of the PCB, hatched ground 240 within layer 2 of the PCB, and traces 252 and 254 within layer 3 of the PCB. In certain examples, hatched ground 240 may include any suitable hatch size, such as 1 mil×1 mil, 3 mil×3 mil, 5 mil×5 mil, 7 mil×7 mil, 9 mil×9 mil, or the like. In an example, the hatch size may refer to a size of the square holes or missing portions of ground plane 240. In certain examples, the smaller the hatch size of hatched ground 240 the greater crosstalk reduction between high-speed signals on differential pairs 202 and 250 as will be described with respect to FIG. 5 below.

Hatched ground 240 may also improve SI performance for high-speed signals transmitted on differential pair 250 by reducing or eliminating common mode impedance and common mode noise between traces 252 and 254 of differential pair 250. Reduction of common mode impedance by hatched ground will be described with respect to FIG. 4 below. In an example, the reduction of common mode noise between traces 252 and 254 may result from hatched ground 240 providing a ground plane of ground wall with respect to traces 252 and 254.

In certain examples, the reduction of the common mode noise between traces 252 and 254 of differential pair 250 may be increased based on hatched ground 240 having an angular offset with respect to traces 252 and 254 of differential pair 250. In a non-limiting embodiment, the angular offset between hatched ground 240 and traces 252 and 254 of differential pair 250 may result in a 10-45% reduction of the common mode noise as compared to the hatched ground and the traces being either substantially parallel or substantially perpendicular. The angular offset between hatched ground 240 and traces 252 and 254 of differential pair 250 may be formed based on any suitable structure of the PCB. For example, hatched ground 240 may be substantially parallel with pads 210 and 212 and traces 252 and 254 may have an angular routing as compared to the pads and hatched ground as shown in FIG. 2. Alternatively, traces 252 and 254 may be substantially perpendicular with pads 210 and 212 and hatched ground 240 may have an angular offset as compared to the pads and the traces as shown in FIG. 3. Other angular offsets between hatched ground 240 and traces 252 and 254 may be utilized without varying from the scope of this disclosure.

Based on the angular offset between hatched ground 240 and traces 252 and 254, the hatched ground may prevent the electric field generated by a signal on trace 252 from affecting the signal on trace 254 as well as preventing the electric field generated by a signal on trace 254 from affecting the signal on trace 252. Based on hatched ground 240 preventing or blocking of the electric fields between traces 252 and 254, the hatched ground may reduce the common mode noise between traces 252 and 254 of differential pair 250.

Figure 4:
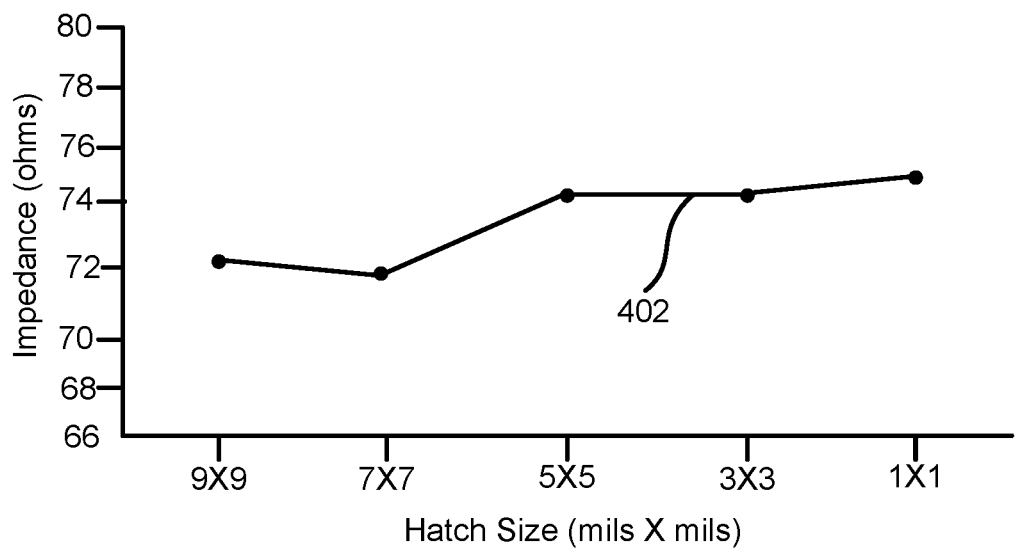
FIG. 4 shows an impedance waveform associated with different embodiments of a hatched ground within a printed circuit board according to at least one embodiment of the present disclosure.

FIG. 4 illustrates an impedance waveform 402 associated with different embodiments of a hatched ground within a PCB, such as hatched grounds 140, 240, and 340 of respective FIGS. 1, 2, and 3, according to at least one embodiment of the present disclosure. As shown in FIG. 4, the vertical axis indicates an impedance control for differential pairs in ohms and the horizontal axis indicates hatch size of a ground hatch in mils X mils. Impedance waveform 402 may be associated with the impedance of differential signals in differential traces of a differential pair, such as pads 110 and 112 and signal traces 120 and 122 of FIG. 1, pads 210 and 212 of FIGS. 2 and 3, and traces 252 and 254 of FIGS. 2 and 3. As illustrated in FIG. 4, as the hatch size of a hatched ground decreases, the impedance control for the differential traces is improved.

In an example, a desired impedance of the differential traces may be any suitable impedance, such as 75 ohms. As illustrated by impedance waveform 402, a hatched ground with a 9 mil×9 mil hatch size may cause an impedance control of around 72 ohms. Impedance waveform 402 illustrates an impedance control just below 72 ohms for a hatched ground with a 7 mil×7 mil hatch size. As illustrated by impedance waveform 402, a hatched ground with a hatched size of 5 mil×5 mil or 3 mil×3 mil may cause an impedance control of substantially equal to 74 ohms. Impedance waveform 402 illustrates an impedance control substantially equal to 75 ohms, such as 74.8 ohms, for a hatched ground with a 1 mil×1 mil hatch size. In previous PCBs, a void under pad configuration may cause an impedance control substantially equal to 78 ohms. Thus in a non-limiting embodiment, hatched grounds 140 and 240 may provide around a 52% or 53% improvement of the impedance control as compared to a void under pad PCB. In an example, the impedance of the differential traces may be measured in any suitable manner, such as by time domain reflectometer (TDR) impedance measurements.

Figure 5:
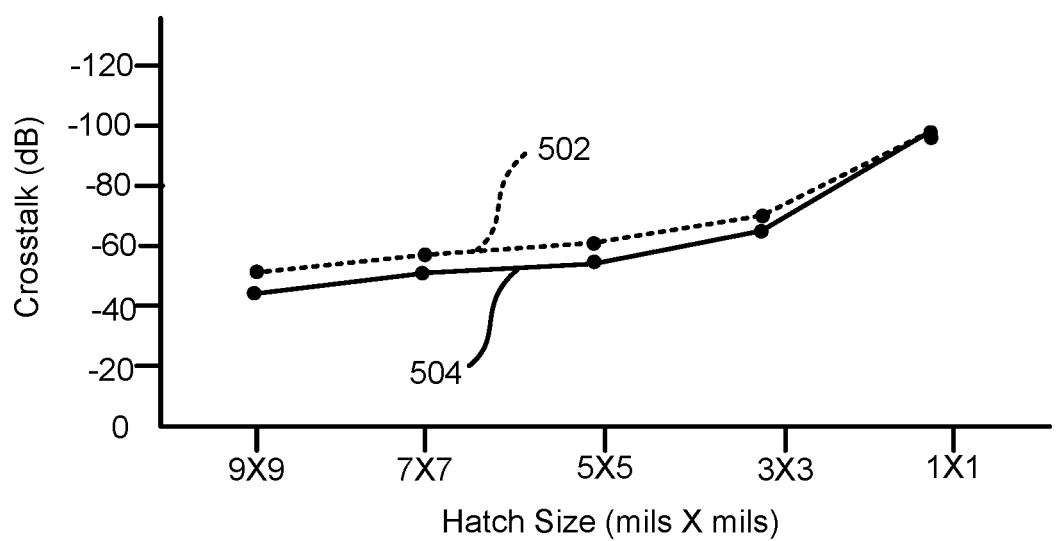
FIG. 5 shows crosstalk waveforms associated with different embodiments of a hatched ground within a printed circuit board according to at least one embodiment of the present disclosure.

FIG. 5 illustrates crosstalk waveforms 502 and 504 associated with different embodiments of a hatched ground within a PCB, such as hatched grounds 140, 240, and 340 of respective FIGS. 1, 2, and 3, according to at least one embodiment of the present disclosure. As shown in FIG. 5, the vertical axis indicates an amount of loss for crosstalk between differential pairs in dB and the horizontal axis indicates hatch size of a ground hatch in mils X mils. Crosstalk waveform 502 may be associated with the far-end crosstalk (FEXT) crosstalk between signals on pads on a surface of the PCB, such as pads 210 and 212 of FIG. 2 and pads 310 and 312 of FIG. 3, and signals on traces within the PCB, such as traces 220 and 222 of FIG. 2 and traces 320 and 322 of FIG. 3. Crosstalk waveform 504 may be associated with the near-end crosstalk (NEXT) crosstalk between signals on pads on a surface of the PCB, such as pads 210 and 212 of FIG. 2 and pads 310 and 312 of FIG. 3, and signals on traces within the PCB, such as traces 220 and 222 of FIGS. 2 and 3.

As illustrated in FIG. 5, as the hatch size of a hatched ground decreases, the crosstalk for the differential pairs is improved. In an example, as the crosstalk between differential pairs is reduced, the SI performance for high-speed signals on the differential pairs increases. The crosstalk between differential pairs illustrated by waveforms 502 and 504 may be associated with a 16 GHz signal.

As illustrated by crosstalk waveform 502, a hatched ground with a 9 mil×9 mil hatch size may have a FEXT crosstalk of around −50 dB. Crosstalk waveform 502 illustrates a FEXT crosstalk a just below −60 dB for a hatched ground with a 7 mil×7 mil or 5 mil×5 mil hatch size. As illustrated by crosstalk waveform 502, a hatched ground with a hatched size of 3 mil×3 mil may have a FEXT crosstalk of around −70 dB. Crosstalk waveform 502 illustrates a FEXT crosstalk a just below −100 dB, such as −98.3 dB, for a hatched ground with a 1 mil×1 mil hatch size. In certain examples, the FEXT crosstalk behavior of a hatched ground may calculated by a cubic or quadratic equation, such as equation 1 below.

$$y=-1.9167x^3+20.821x^2-77.262x+156.2 \qquad \text{EQ. 1}$$

In equation 1 above, variable y may be associated with the FEXT crosstalk and the variable x may be associated with the hatch size of the hatched ground.

As illustrated by crosstalk waveform 504, a hatched ground with a 9 mil×9 mil hatch size may have a NEXT crosstalk of around −45 dB. Crosstalk waveform 502 illustrates a NEXT crosstalk substantially equal to −50 dB for a hatched ground with a 7 mil×7 mil or 5 mil×5 mil hatch size. As illustrated by crosstalk waveform 502, a hatched ground with a hatched size of 3 mil×3 mil may have a NEXT crosstalk of around −60 dB. Crosstalk waveform 502 illustrates a NEXT crosstalk a just below −100 dB, such as −97.1 dB, for a hatched ground with a 1 mil×1 mil hatch size.

Figure 6:
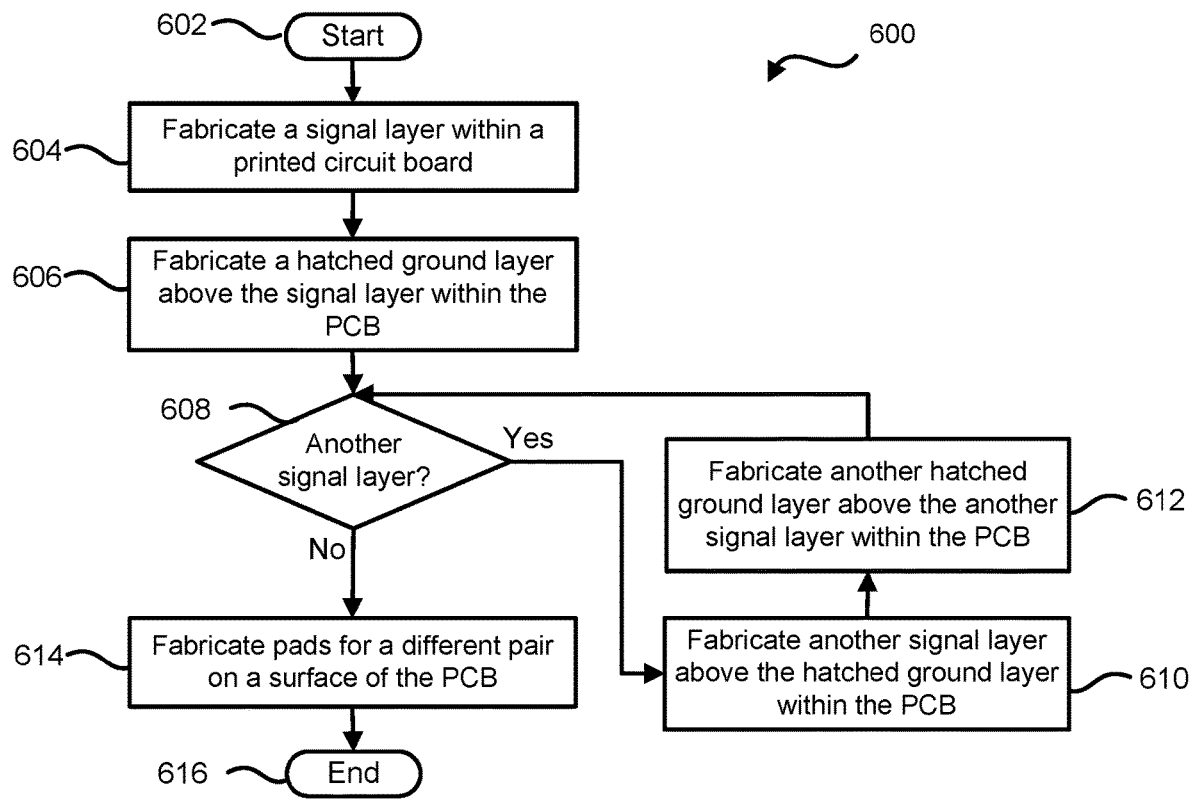
FIG. 6 is a flow diagram of method for fabricating a printed circuit board with a hatched ground within the printed circuit board according to at least one embodiment of the present disclosure.

FIG. 6 is a flow diagram of method 600 for fabricating a PCB with a hatched ground within the PCB according to at least one embodiment of the present disclosure, starting a block 602. It will be readily appreciated that not every method step set forth in this flow diagram is always necessary, and that certain steps of the methods may be combined, performed simultaneously, in a different order, or perhaps omitted, without varying from the scope of the disclosure. FIG. 6 may be employed in whole, or in part, any other type of controller, device, module, processor, or any combination thereof, operable to employ all, or portions of, the method of FIG. 6.

At block 604, a signal layer is fabricated within a printed circuit board. At block 606, a hatched ground layer is fabricated within a layer of the PCB above the signal layer. At block 608, a determination is made whether another signal layer is wanted within the PCB. In response to another signal layer being wanted, another signal layer is fabricated within a layer of the PCB above the hatched ground layer at block 608. At block 610, another hatched ground layer is fabricated within a layer of the PCB above the another signal layer, and the flow continues as stated above at block 608. In response to another signal layer not being wanted, pads for a differential pair are fabricated on a surface of the PCB at block 614, and the flow ends at block 616.

FIG. 7 illustrates a generalized embodiment of an information handling system 700. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 700 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 700 can include processing resources for executing machine-executable code, such as a central processing unit (CPU), a programmable logic array (PLA), an embedded device such as a System-on-a-Chip (SoC), or other control logic hardware. Information handling system 700 can also include one or more computer-readable medium for storing machine-executable code, such as software or data. Additional components of information handling system 700 can include one or more storage devices that can store machine-executable code, one or more communications ports for communicating with external devices, and various input and output (I/O) devices, such as a keyboard, a mouse, and a video display. Information handling system 700 can also include one or more buses operable to transmit information between the various hardware components.

Information handling system 700 can include devices or modules that embody one or more of the devices or modules described below, and operates to perform one or more of the methods described below. Information handling system 700 includes a processors 702 and 704, an input/output (I/O) interface 710, memories 720 and 725, a graphics interface 730, a basic input and output system/universal extensible firmware interface (BIOS/UEFI) module 740, a disk controller 750, a hard disk drive (HDD) 754, an optical disk drive (ODD) 756, a disk emulator 760 connected to an external solid state drive (SSD) 762, an I/O bridge 770, one or more add-on resources 774, a trusted platform module (TPM) 776, a network interface 780, a management device 790, and a power supply 795. Processors 702 and 704, I/O interface 710, memory 720, graphics interface 730, BIOS/UEFI module 740, disk controller 750, HDD 754, ODD 756, disk emulator 760, SSD 762, I/O bridge 770, add-on resources 774, TPM 776, and network interface 780 operate together to provide a host environment of information handling system 700 that operates to provide the data processing functionality of the information handling system. The host environment operates to execute machine-executable code, including platform BIOS/UEFI code, device firmware, operating system code, applications, programs, and the like, to perform the data processing tasks associated with information handling system 700.

In the host environment, processor 702 is connected to I/O interface 710 via processor interface 706, and processor 704 is connected to the I/O interface via processor interface 708. Memory 720 is connected to processor 702 via a memory interface 722. Memory 725 is connected to processor 704 via a memory interface 727. Graphics interface 730 is connected to I/O interface 710 via a graphics interface 732, and provides a video display output 736 to a video display 734. In a particular embodiment, information handling system 700 includes separate memories that are dedicated to each of processors 702 and 704 via separate memory interfaces. An example of memories 720 and 730 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 740, disk controller 750, and I/O bridge 770 are connected to I/O interface 710 via an I/O channel 712. An example of I/O channel 712 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 710 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 740 includes BIOS/UEFI code operable to detect resources within information handling system 700, to provide drivers for the resources, initialize the resources, and access the resources. BIOS/UEFI module 740 includes code that operates to detect resources within information handling system 700, to provide drivers for the resources, to initialize the resources, and to access the resources.

Disk controller 750 includes a disk interface 752 that connects the disk controller to HDD 754, to ODD 756, and to disk emulator 760. An example of disk interface 752 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 760 permits SSD 764 to be connected to information handling system 700 via an external interface 762. An example of external interface 762 includes a USB interface, an IEEE 1394 (Firewire) interface, a proprietary interface, or a combination thereof. Alternatively, solid-state drive 764 can be disposed within information handling system 700.

I/O bridge 770 includes a peripheral interface 772 that connects the I/O bridge to add-on resource 774, to TPM 776, and to network interface 780. Peripheral interface 772 can be the same type of interface as I/O channel 712, or can be a different type of interface. As such, I/O bridge 770 extends the capacity of I/O channel 712 when peripheral interface 772 and the I/O channel are of the same type, and the I/O bridge translates information from a format suitable to the I/O channel to a format suitable to the peripheral channel 772 when they are of a different type. Add-on resource 774 can include a data storage system, an additional graphics interface, a network interface card (NIC), a sound/video processing card, another add-on resource, or a combination thereof. Add-on resource 774 can be on a main circuit board, on separate circuit board or add-in card disposed within information handling system 700, a device that is external to the information handling system, or a combination thereof.

Network interface 780 represents a NIC disposed within information handling system 700, on a main circuit board of the information handling system, integrated onto another component such as I/O interface 710, in another suitable location, or a combination thereof. Network interface device 780 includes network channels 782 and 784 that provide interfaces to devices that are external to information handling system 700. In a particular embodiment, network channels 782 and 784 are of a different type than peripheral channel 772 and network interface 780 translates information from a format suitable to the peripheral channel to a format suitable to external devices. An example of network channels 782 and 784 includes InfiniBand channels, Fibre Channel channels, Gigabit Ethernet channels, proprietary channel architectures, or a combination thereof. Network channels 782 and 784 can be connected to external network resources (not illustrated). The network resource can include another information handling system, a data storage system, another network, a grid management system, another suitable resource, or a combination thereof.

Management device 790 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 700. In particular, management device 790 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 700, such as system cooling fans and power supplies. Management device 790 can include a network connection to an external management system, and the management device can communicate with the management system to report status information for information handling system 700, to receive BIOS/UEFI or system firmware updates, or to perform other task for managing and controlling the operation of information handling system 700. Management device 790 can operate off of a separate power plane from the components of the host environment so that the management device receives power to manage information handling system 700 when the information handling system is otherwise shut down. An example of management device 790 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 790 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system comprising:
   a printed circuit board including:
   first and second pads of a first differential pair on a surface of the printed circuit board;
   a hatched ground within a first layer of the printed circuit board, wherein the first layer is located within the printed circuit board; and
   first and second traces of a second differential pair within a second layer of the printed circuit board, wherein the hatched ground dampens crosstalk between signals on the traces and signals on the differential pair pads, wherein the second layer is located within the printed circuit board and further from the surface of the printed circuit board than the first layer, wherein the hatch ground has an angular offset with respect to the first and second traces of the second differential pair within the first layer, wherein the angular offset is created based on the hatched ground being routed substantially parallel with the first and second pads of the differential pair, and the first and second traces being routed at an angle with respect to the hatched ground and the first and second pads.

2. The information handling system of claim 1, wherein the printed circuit board further includes:
   third and fourth traces of the first differential pair within a third layer of the printed circuit board, wherein the third trace is electrically and physical connected to the first pad, and the fourth trace is electrically and physical connected to the second pad.

3. The information handling system of claim 1, wherein the first and second traces of the second differential pair are routed below the first and second pads and the hatched ground.

4. The information handling system of claim 1, wherein an amount of crosstalk dampening increases as a hatch size of the hatched ground decreases.

5. The information handling system of claim 1, wherein the angular offset between the hatched ground and the first and second traces of the second differential pair dampens common mode noise for signals transmitted on the first and second traces of the second differential pair.

6. The information handling system of claim 5, wherein an amount of common mode noise dampening increases as a hatch size of the hatched ground decreases.

7. The information handling system of claim 1, wherein the angular offset is created based on the first and second traces of the second differential pair being routed substantially perpendicular to the first and second pads of the differential pair, and the hatched ground being routed at an angle with respect to the first and second traces and the first and second pads.

8. The information handling system of claim 1, wherein the first layer is between the surface of the printed circuit board and the second layer within the printed circuit board.

9. An information handling system comprising:
   a printed circuit board including:
   first and second pads of a first differential pair on a surface of the printed circuit board;
   a hatched ground within a first layer of the printed circuit board; and
   first and second traces of a second differential pair within a second layer of the printed circuit board, wherein the hatched ground dampens crosstalk between signals on the traces and signals on the differential pair pads, wherein the first and second traces of the second differential pair are routed below the first and second pads and the hatched ground, and wherein the hatch ground has an angular offset with respect to the first and second traces of the second differential pair within the first layer, wherein the angular offset is created based on the first and second traces of the second differential pair being routed substantially perpendicular to the first and second pads of the differential pair, and the hatched ground being routed at an angle with respect to the first and second traces and the first and second pads.

10. The information handling system of claim 9, wherein the printed circuit board further includes:
    third and fourth traces of the first differential pair within a third layer of the printed circuit board, wherein the third trace is electrically and physical connected to the first pad, and the fourth trace is electrically and physical connected to the second pad.

11. The information handling system of claim 9, wherein an amount of crosstalk dampening increases as a hatch size of the hatched ground decreases.

12. The information handling system of claim 9, wherein the angular offset between the hatched ground and the first and second traces of the second differential pair dampens common mode noise for signals transmitted on the first and second traces of the second differential pair.

13. The information handling system of claim 12, wherein an amount of common mode noise dampening increases as a hatch size of the hatched ground decreases.

14. The information handling system of claim 9, wherein the angular offset is created based on the hatched ground being routed substantially parallel with the first and second pads of the differential pair, and the first and second traces being routed at an angle with respect to the hatched ground and the first and second pads.

15. A method comprising:
fabricating traces of a differential pair within a first layer of a printed circuit board of an information handling system, wherein the first layer is located within the printed circuit board;
fabricating a hatched ground on a second layer within the printed circuit board, wherein the second layer is located within the printed circuit board and closer to a surface of the printed circuit board than the first layer;
fabricating differential pair pads on the surface of the printed circuit board, wherein the hatched ground dampens crosstalk between signals on the traces and signals on the differential pair pads, wherein the hatch ground has an angular offset with respect to the first and second traces of the second differential pair within the first layer, wherein the angular offset is created based on the hatched ground being routed substantially parallel with the first and second pads of the differential pair, and the first and second traces being routed at an angle with respect to the hatched ground and the first and second pads.

16. The method of claim 15, wherein the second layer is between the surface of the printed circuit board and the first layer within the printed circuit board.

17. The method of claim 15, wherein the hatch ground has an angular offset with respect to the traces of the differential pair within the first layer.

* * * * *